(12) United States Patent
Nagata

(10) Patent No.: US 6,190,790 B1
(45) Date of Patent: Feb. 20, 2001

(54) RESISTOR MATERIAL, RESISTIVE PASTE AND RESISTOR USING THE RESISTOR MATERIAL, AND MULTI-LAYERED CERAMIC SUBSTRATE

(75) Inventor: Keisuke Nagata, Omihachiman (JP)

(73) Assignee: Murata Manufacturing Co., Ltd. (JP)

( * ) Notice: Under 35 U.S.C. 154(b), the term of this patent shall be extended for 0 days.

(21) Appl. No.: 09/253,990

(22) Filed: Feb. 22, 1999

(30) Foreign Application Priority Data

| Feb. 23, 1998 | (JP) | 10-040210 |
| Feb. 23, 1998 | (JP) | 10-040211 |
| Feb. 23, 1998 | (JP) | 10-040212 |
| Jan. 27, 1999 | (JP) | 11-018154 |
| Jan. 27, 1999 | (JP) | 11-018155 |
| Jan. 27, 1999 | (JP) | 11-018156 |

(51) Int. Cl.$^7$ .............. B32B 9/00; B32B 19/00
(52) U.S. Cl. .............. 428/701; 428/699; 428/701; 428/702; 428/704; 428/689; 501/32; 501/96.3; 252/500; 252/513; 252/518.1; 252/519.12; 252/520.22; 252/521.4
(58) Field of Search .............. 501/32, 96.3; 428/699, 428/704, 701, 702, 689; 252/500, 513, 518.1, 519.12, 519.14, 520.22, 521.4

(56) References Cited

U.S. PATENT DOCUMENTS

| 4,251,397 | * | 2/1981 | Scheiber | 252/521 |
| 5,036,027 | * | 7/1991 | Watanabe et al. | 501/96 |

FOREIGN PATENT DOCUMENTS

| 95/02563 | * | 1/1995 | (WO) | 35/581 |

* cited by examiner

Primary Examiner—Deborah Jones
Assistant Examiner—Lymarie Miranda
(74) Attorney, Agent, or Firm—Ostrolenk, Faber, Gerb & Soffen, LLP

(57) ABSTRACT

The invention provides a resistor material comprising a conductive material and an additive; said conductive material comprising a material represented by the general formula of $Nb_xLa_{1-x}B_{6-4x}$ (x=0.1 to 0.9) and/or a material comprising 100 to about 90 mol % of $NbB_2$ and 0 to about 10 mol % of $LaB_6$; and said additive comprising titanium oxide, cobalt oxide and zinc or silicon oxide or comprising AlN and $TiO_2$.

20 Claims, 4 Drawing Sheets

○ SAMPLES IN WHICH ADDITIVES ARE NOT ADDED TO THE SOLID SOLUTION SAMPLE OR MIXTURE SAMPLE.

△ SAMPLES IN WHICH ADDITIVES OUT OF THE PREFERRED RANGE OF THE PRESENT INVENTION ARE ADDED.

● SAMPLES IN WHICH ADDITIVES WITHIN THE PREFERRED RANGE OF THE PRESENT INVENTION ARE ADDED.

o SAMPLES IN WHICH ADDITIVES ARE NOT ADDED TO THE SOLID SOLUTION SAMPLE OR MIXTURE SAMPLE.

△ SAMPLES IN WHICH ADDITIVES OUT OF THE PREFERRED RANGE OF THE PRESENT INVENTION ARE ADDED.

• SAMPLES IN WHICH ADDITIVES WITHIN THE PREFERRED RANGE OF THE PRESENT INVENTION ARE ADDED.

o SAMPLES IN WHICH ADDITIVES ARE NOT ADDED TO THE SOLID SOLUTION SAMPLE OR MIXTURE SAMPLE.

△ SAMPLES IN WHICH ADDITIVES OUT OF THE PREFERRED RANGE OF THE PRESENT INVENTION ARE ADDED.

• SAMPLES IN WHICH ADDITIVES WITHIN THE PREFERRED RANGE OF THE PRESENT INVENTION ARE ADDED.

US 6,190,790 B1

RESISTOR MATERIAL, RESISTIVE PASTE AND RESISTOR USING THE RESISTOR MATERIAL, AND MULTI-LAYERED CERAMIC SUBSTRATE

BACKGROUND OF THE INVENTION

1. Field of the Invention

The present invention relates to a resistor material, a resistive paste and a resistor using the resistor material, and a multi-layered ceramic substrate. In particular, the present invention relates to a resistive paste capable of being baked in a neutral or reducing atmosphere, a resistor material advantageously included in this resistive paste and a resistor obtainable by using this resistive paste.

2. Description of the Related Art

A circuit pattern constituted of electrodes and resistors has been usually formed on a ceramic substrate comprising alumina so that various kinds of electronic components can be mounted thereon. A metallic paste of precious metals such as silver and a silver-palladium alloy is conventionally screen-printed and baked in the air in order to form electrodes or electrode patterns.

A high-density printed circuit is desirably formed by laminating the substrates in order to form a three dimensional wiring circuit, thereby attempting to further compact the electronic appliances. However, high melting point metals such as tungsten and molybdenum should be used as conductive materials in forming wiring layers in the laminated substrate when conventional general purpose alumina substrates are used because the sintering temperature of alumina is high. Therefore, the application field of the printed circuit is restricted since the metals described above have high resistivity.

For the purpose of solving the problems as hitherto described, a low sintering temperature substrate (for example, a composite substrate comprising a ceramic and glass) that can be sintered at a low temperature (1000° C. or less) and that is able to use such metals as silver, palladium or copper as metallic inner layer materials have been used in recent years.

The precious metal paste as described above may be used for the electrode materials in such low sintering temperature substrate. However, the precious metal paste is not only expensive but also has a high impedance and has a drawback in that the practical problem electromigration is liable to occur.

On the contrary, it was found and noticed that a high quality electrode pattern could be produced with a cheap production cost when a paste containing a base metal such as copper that has low impedance and does not cause electromigration is screen-printed on a sintered substrate or on a green sheet to be sintered in a neutral or reducing atmosphere.

The resistor provided on the substrate so as to put a plurality of base metal electrodes formed after baking the base metal paste into electrical continuity, or the resistive paste for forming the resistor pattern can not be used when $RuO_2$ based materials are used as conductive materials since they are liable to be reduced. A material capable of being baked in a neutral or reducing atmosphere such as nitrogen is desirable.

In compliance with the foregoing requirements, a $LaB_6$ based resistive paste disclosed in Japanese Examined Patent Publication No. 55-30889, a $NbB_2$ based resistive paste disclosed in Japanese Unexamined Patent Publication No. 63-224301 and a resistive paste of $Nb_xLa_{1-x}B_{6-4x}$ solid solutions disclosed in Japanese Unexamined Patent Publication No. 2-249203 are proposed as the resistive paste capable of being baked in a neutral or reducing atmosphere.

A resistor formed by using $Nb_xLa_{1-x}B_{6-4x}$ as conductive materials has an advantage over the resistor formed by using resistive pastes such as $LaB_6$ in that the former has a wide range of surface resistivity with good repeatability when the mixing ratio between the conductive material and glass frit is adjusted.

However, the temperature coefficient of resistance (referred to TCR hereinafter) of the resistor formed of $Nb_xLa_{1-x}B_{6-4x}$ based resistive pastes tends to shift toward positive (+) direction and its absolute value leaves from zero in the low surface resistivity region (about $10\Omega/\square$ to 1 $k\Omega/\square$). Although it was disclosed in Japanese Unexamined Patent Publication No. 7-192903 that TCR on the alumina substrate can be shifted toward the minus direction by adding $TiO_2$ as a first additive and $Co_3O_4$, CoO and $Fe_2O_3$ as second additives, the TCR regulating effect and repeatability are not sufficient especially in the low resistance region when the resistor is formed on a low sintering temperature substrate such as a composite substrate of a ceramic and glass, and it is currently impossible to obtain the required TCR characteristic.

A similar situation is found in the resistor formed of a resistive paste such as $NbB_2$.

On the other hand, the TCR of the resistor formed of $Nb_xLa_{1-x}B_{6-4x}$ based resistive pastes tends to shift toward negative (−) direction and its absolute value leaves from zero in the high surface resistivity region (about $10k\Omega/\square$ or more). Although it was disclosed in Japanese Unexamined Patent Publication No. 5-335107 that TCR on the alumina substrate can be shifted toward the plus direction by adding any one or a plurality of $B_2O_3$, $SiO_2$, $Al_2O_3$, CrB, NiB, $TaSi_2$, Ta and AlN, the TCR regulating effect and repeatability are not sufficient especially in the low resistance region when the resistor is formed on a low sintering temperature substrate such as a composite substrate of a ceramic and glass, and it is currently impossible to obtain the required TCR characteristic.

SUMMARY OF THE INVENTION

To overcome the above described problems, preferred embodiments of the present invention provide resistor materials, resistive pastes and resistors using the resistor materials, and multi-layered ceramic substrates. The resistive pastes comprise $Nb_xLa_{1-x}B_{6-4x}$ or $NbB_2$ in which TCR in the low surface resistance region (about $10\Omega/\square$ to 1 $k\Omega/\square$) is adjustable so as to be shifted toward the minus direction to come close to zero on the low sintering temperature substrate, and in which TCR in the high surface resistance region (about 10 $k\Omega/\square$) is adjustable so as to be shifted toward the plus direction to come close to zero on the low sintering temperature substrate, respectively.

One preferred embodiment of the present invention provides a resistor material comprising a conductive material and an additive; said conductive material comprising one of a material represented by the general formula of $Nb_xLa_{1-x}B_{6-4x}$ (x=about 0.1 to 0.9) and/or a material comprising 100 to about 90 mol % of $NbB_2$ and 0 to about 10 mol % of $LaB_6$; and said additive comprising titanium oxide ($TiO_2$), cobalt oxide (at least one of $Co_3O_4$ and CoO) and zinc oxide (ZnO).

The above described resistor material may further comprise a non-reducing glass frit; said conductive material may comprise said material of formula $Nb_xLa_{1-x}B_{6-4x}$; and said additive comprises about 1 to 10 parts by weight of titanium oxide ($TiO_2$), about 1 to 15 parts by weight of cobalt oxide (at least one of $Co_3O_4$ and CoO) and about 1 to 5 parts by weight of zinc oxide (ZnO) relative to 100 parts by weight of the combined amount of said conductive material and said non-reducing glass frit.

The above described resistor material may further comprise a non-reducing glass frit; said conductive material comprises said material comprising 100 to about 90 mol % of $NbB_2$ and 0 to about 10 mol % of $LaB_6$; and said additive comprises about 1 to 10 parts by weight of titanium oxide ($TiO_2$), about 1 to 15 parts by weight of cobalt oxide (at least one of $Co_3O_4$ and Coo) and about 1 to 5 parts by weight of zinc oxide (ZnO) relative to 100 parts by weight of the combined amount of said conductive material and said non-reducing glass frit.

In the above described resistor material, the amount ratio of said conductive material to said non-reducing glass frit is preferably in a range of from about 70 through 10 parts by weight to from about 30 through 90 parts by weight.

The preferred embodiment of the present invention further provides a resistive paste obtainable by adding an organic vehicle to the above described resistor followed by kneading.

The above described resistive paste is advantageously used for forming a resistor on a low sintering temperature substrate; said low sintering temperature substrate may have a composition comprising about 15 to 75% by weight of BaO, about 25 to 80% by weight of $SiO_2$, about 30% by weight or less of $Al_2O_3$, about 1.5 to 5% by weight of $B_2O_3$ and about 1.5 to 5% by weight of CaO.

The preferred embodiment of the present invention further provides a resistor obtainable by coating and baking the above described resistive paste.

The preferred embodiment of the present invention further provides a multi-layered ceramic substrate including the above described resistor.

Another preferred embodiment of the present invention provides a resistor material comprising a conductive material and an additive; said conductive material comprising a material represented by a general formula of $Nb_xLa_{1-x}B_{6-4x}$ (x=about 0.1 to 0.9); and said additive comprising titanium oxide ($TiO_2$), cobalt oxide (at least one of $Co_3O_4$ and CoO) and silicon oxide ($SiO_2$).

The above described resistor material may further comprise a non-reducing glass frit; and said additive may comprise about 1 to 5 parts by weight of titanium oxide ($TiO_2$), about 1 to 10 parts by weight of cobalt oxide (at least one of $Co_3O_4$ and CoO) and about 1 to 5 parts by weight of silicon oxide ($SiO_2$) relative to 100 parts by weight of the combined amount of said conductive material and said non-reducing glass frit.

In the above described resistor material, the amount ratio of said conductive material to said non-reducing glass frit is preferably in a range of from about 70 through 10 parts by weight to from about 30 through 90 parts by weight.

The preferred embodiment of the present invention provides a resistive paste obtainable by adding an organic vehicle into the above described resistor material followed by kneading.

The above described resistive paste is advantageously used for forming a resistor on a low sintering temperature substrate; said low sintering temperature substrate may have a composition comprising about 15 to 75% by weight of BaO, about 25 to 80% by weight of $SiO_2$, about 30% by weight or less of $Al_2O_3$, about 1.5 to 5% by weight of $B_2O_3$ and about 1.5 to 5% by weight of CaO.

The preferred embodiment of the present invention further provides a resistor obtainable by coating and baking the above described resistive paste.

The preferred embodiment of the present invention further provides a multi-layered ceramic substrate including the above described resistor.

Yet another preferred embodiment of the present invention provides a resistor material comprising a conductive material and an additive; said conductive material comprising a conductive material represented by $Nb_xLa_{1-x}B_{6-4x}$ (x=about 0.1 to 0.9); and said additive comprising aluminum nitride (AlN) having a mean particle size of about 0.5 μm or less and silicon oxide ($SiO_2$) having a mean particle size of about 0.5 μm or less.

The above described resistor material may further comprise a non-reducing glass frit; and said additive comprises about 5 to 15 parts by weight of aluminum nitride (AlN) having a mean particle size of about 0.5 μm or less and about 5 to 15 parts by weight of silicon oxide ($SiO_2$) having a mean particle size of about 0.5 μm or less relative to 100 parts by weight of the combined amount of said conductive material and said non-reducing glass frit.

In the above described resistor material, the amount ratio of said conductive material to said non-reducing glass frit is preferably in a range of from about 70 through 10 parts by weight to from about 30 trough 90 parts by weight.

The preferred embodiment of the present invention provides a resistive paste obtainable by adding an organic vehicle into the above described resistor material followed by kneading.

The above described resistive paste is advantageously used for forming a resistor on a low sintering temperature substrate; said low sintering temperature substrate may have a composition comprising about 15 to 75% by weight of BaO, about 25 to 80% by weight of $SiO_2$, about 30% by weight or less of $Al_2O_3$, about 1.5 to 5% by weight of $B_2O_3$ and about 1.5 to 5% by weight of CaO.

The preferred embodiment of the present invention further provide a resistor obtainable by coating and baking the above described resistive paste.

The preferred embodiment of the present invention further provide a multi-layered ceramic substrate including the above described resistor.

Other features and advantages of the present invention will become apparent from the following description of the invention which refers to the accompanying drawings.

DESCRIPTION OF THE PREFERRED EMBODIMENTS

[First Preferred Embodiment]

Figure 1:
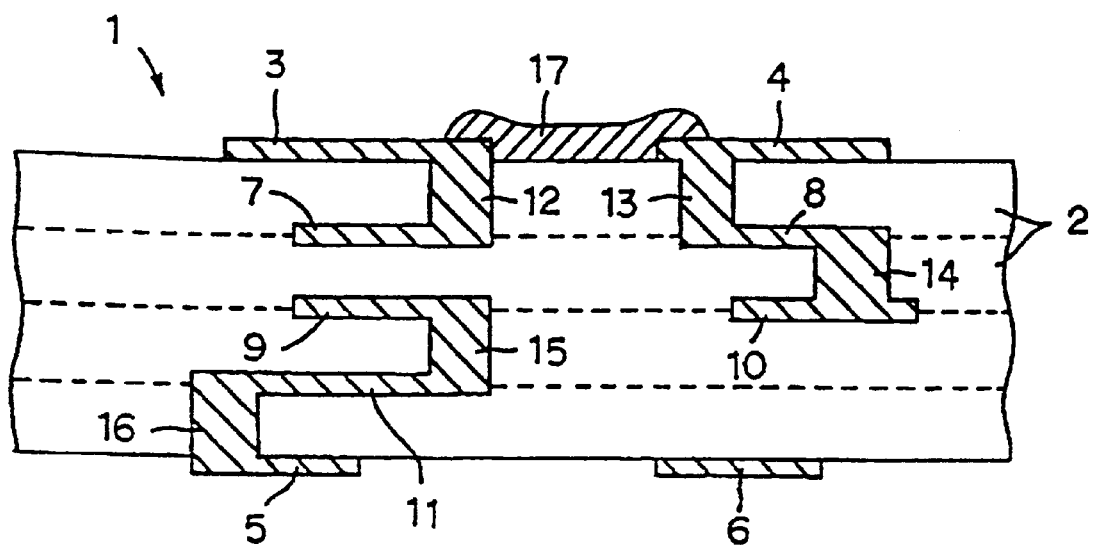
FIG. 1 is a sectional view showing a multi-layered ceramic substrate provided by each of the preferred embodiments of the present invention.

The resistive paste according to a first preferred embodiment of the present invention comprises a conductive material represented by a general formula of $Nb_xLa_{1-x}B_{6-4x}$ (x=about 0.1 to 0.9), a non-reducing glass frit and an additive, the additive added to the resistor material comprising about 1 to 10 parts by weight of titanium oxide ($TiO_2$), about 1 to 15 parts by weight of cobalt oxide (at least one of $Co_3O_4$ and $CoO$) and about 1 to 5 parts by weight of zinc oxide (ZnO) relative to 100 parts by weight of the combined amount of the conductive material and the non-reducing glass frit.

Another resistive paste may comprise a conductive material comprising 100 to about 90 mol % of $NbB_2$ and 0 to about 10 mol % of $LaB_6$, a non-reducing glass frit and an additive, the additive added to the resistor material comprising about 1 to 10 parts by weight of titanium oxide ($TiO_2$), about 1 to 15 parts by weight of cobalt oxide (at least one of $Co_3O_4$ and $CoO$) and about 1 to 5 parts by weight of zinc oxide (ZnO) relative to 100 parts by weight of the combined amount of the conductive material and the non-reducing glass frit.

A resistive paste is formed by adding an organic vehicle to each of the above described resistive materials followed by kneading. The resistive paste is formed into a resistor by coating and baking the paste.

The particle size of the conductive material of $Nb_xLa_{1-x}B_{6-4x}$ or $NbB_2$ is preferably in a range of about 0.1 to 5 $\mu$m, more preferably in a range of about 0.1 to 3 $\mu$m.

A borosilicate glass containing Ba, Ca or other alkaline earth metals, or a boroalumino silicate glass is selected for use in the non-reducing glass frit. The particle size of the non-reducing glass frit is preferably in a range of about 1 to 10 $\mu$m, more preferably in a range of about 1 to 5 $\mu$m.

The additive added to the resistor material contains about 1 to 10 parts by weight of titanium oxide ($TiO_2$), about 1 to 15 parts by weight of cobalt oxide (at least one of $Co_3O_4$ and CoO) and about 1 to 5 parts by weight of zinc oxide (ZnO) relative to 100 parts by weight of the combined amount of the conductive material and the non-reducing glass frit. This is because when the amount of addition of each substance is lower than the range described above, the resistance and TCR regulating effect of the resistor obtained from the resistive paste comprising respective resistive materials may be insufficient while when the amount of addition is larger than the range described above, not only the resistance becomes high but also TCR may deviate from zero or its repeatability becomes poor.

The preferable amount ratio of the conductive material and non-reducing glass frit in the foregoing resistor material according to this embodiment is selected to be in a range from about 70 through 10 parts by weight to from about 30 through 90 parts by weight. This is because adhesive property to the substrate becomes good and enables one to obtain a resistive paste from which the glass component does not flow out. In more detail, when the proportion of the non-reducing glass frit is lower than the range described above, the adhesive property of the resistor, obtained by coating and baking the resistive paste containing the resistive materials, is decreased while when the proportion is larger than the range described above, the glass component in the resistive paste may flow out during the baking process, thereby deteriorating solder adhesion of the electrodes to be disposed in close adjoining relation with each other. Therefore, the substrate becomes practically inapplicable due to rapid change of resistance or poor repeatability.

The required printing characteristic is given to the resistive paste according to the present invention by adding and kneading an organic vehicle to the mixture (a solid fraction) of the conductive material and non-reducing glass frit described previously. A variety of organic vehicles, such as a solution of ethyl cellulose resins and acrylate resins, used in thick film pastes and dissolved in a high boiling point solvent such as terpenes like $\alpha$-terepineol, kerosine and carbitol acetate, can be used. Additives for endowing the paste with thixotropic property may be also added.

Use of the resistive paste, obtained by adding, followed by kneading, an organic vehicle into a resistor material containing about 1 to 10 parts by weight of titanium oxide ($TiO_2$), about 1 to 15 parts by weight of cobalt oxide (at least one of $Co_3O_4$ and CoO) and about 1 to 5 parts by weight of zinc oxide (ZnO) relative to 100 parts by weight of a mixture comprising about 70 to 10 parts by weight of the conductive material and about 30 to 90 parts by weight of the non-reducing glass frit, allows a resistor having a TCR which is more close to zero to be securely formed even when the paste is coated and baked on the low sintering temperature substrate.

It was also possible for the resistive paste according to the present invention to form a resistor having TCR close to zero when the paste is coated and baked not only on the alumina substrate but also on a low sintering temperature substrate in which a sufficient regulation effect of TCR has not been fully displayed containing about 15 to 75% by weight of BaO, about 25 to 80% by weight of $SiO_2$, about 30% by weight or less of $Al_2O_3$, about 1.5 to 5% by weight of $B_2O_3$ and about 1.5 to 5% by weight of CaO, for example.

The resistor formed by coating and baking the resistive paste according to the present invention has a good adhesive property with the substrate, having a wide range of practically applicable surface resistivity as well as good TCR.

FIG. 1 is a sectional view showing a multi-layered ceramic substrate according to the preferred embodiment of the present invention.

The multi-layered ceramic substrate 1 comprises a plurality of ceramic layers 2. To manufacture the multi-layered ceramic substrate 1, a multi-layered ceramic body provided by laminating a plurality of green sheets each of which has a specific ceramic composition is baked. The ceramic layers 2 are the result of the green sheets after the baking procedure.

On the outer surface of the multi-layered ceramic substrate 1, surface conductors 3, 4, 5 and 6 are provided. Inside the multi-layered ceramic substrate 1, inner conductors 7, 8, 9, 10 and 11 are provided on specific interfaces between the ceramic layers 2, and via-hole conductors 12, 13, 14, 15 and 16 are provided so as to pass through the specific ceramic layers 2. A resistor 17 is provided on the outer surface of the multi-layered ceramic substrate 1 so as to connect the surface conductors 3 and 4.

The above described surface conductors 3 to 6, inner conductors 7 to 11 and via-hole conductors 12 to 16 are formed by providing a metal paste to the above described multi-layered ceramic body and then baking the metal paste with the multi-layered ceramic body at the same time. In this case, a base-metal paste is preferably used for the metal paste and the firing is performed in a neutral or reducing atmosphere.

The resistor 17 is formed by providing the above described resistive paste of the present invention to the multi-layered ceramic body so as to connect the baked surface conductors 3 and 4 and then baking the resistive paste in a neutral or reducing atmosphere.

It should be noted that the structure and arrangement, specifically the electric elements and electric connection arrangement of the multi-layered ceramic substrate 1 shown in FIG. 1, is only one example of the multi-layered ceramic substrate to which the present invention is applicable.

A specific example will be described hereinafter.

A substrate with electrodes was produced by the following procedure.

BaO, $SiO_2$, $Al_2O_3$, CaO and $B_2O_3$ blended in a weight ratio of 30:60:5:2:3 were crushed and mixed, and the mixture was calcinated at a temperature of 850 to 950° C. followed by further crushing. After adding an organic binder to the powder obtained, the mixture was formed into a sheet with a thickness of 128 μm by the doctor blade method. The sheet cut into a given size was then screen-printed with a copper paste followed by drying and press mold to obtain a substrate. This substrate was calcinated and baked in an electric furnace at a temperature of 850 to 1000° C. in a nitrogen (99.7 to 99.8% of $N_2$)—steam atmosphere using nitrogen as a carrier gas containing a small amount of oxygen and hydrogen, thereby obtaining a substrate on which copper electrodes are formed.

Meanwhile, after producing a conductive material having a composition of $Nb_xLa_{1-x}B_{6-4x}$ (x=about 0.1 to 0.9) and non-reducing glass frit by the procedure to be described hereinafter, a resistive paste was produced by adding the required additive and organic vehicle.

Firstly, powders of $NbB_2$ and $LaB_6$ as starting materials of the conductive material were prepared. Respective powders were weighed and mixed to be a composition of $Nb_xLa_{1-x}B_{6-4x}$ (x=about 0.1 to 0.9) and a synthetic material forming a solid solution containing $NbB_2$ and $LaB_6$ was produced by baking in a nitrogen ($N_2$) atmosphere for more than 2 hours in a crucible while setting the peak temperature at 1000° C. The temperature increase rate was adjusted to 3° C. per minute. The synthetic material obtained was crushed to a mean particle size of 0.5 μm using a vibration mill and a conductive material with a composition of $Nb_xLa_{1-x}B_{6-4x}$ was obtained thereafter by drying the crushed powder.

A mixed conductive material was also obtained by crushing a powder, prepared by weighing and mixing $NbB_2$ and $LaB_6$ into a composition comprising 100 to about 90 mol % of $NbB_2$ and 0 to about 10 mol % of $Lab_6$, up to a mean particle size of 0.5 μm using a vibration mill followed by drying.

Besides the conductive material, $B_2O_3$, $SiO_2$, BaO, CaO, $Nb_2O_5$ and $K_2O$ were prepared as starting materials of the non-reducing glass frit, which were mixed in a molar ratio of 35.56:31.24:17.78:10.04:2.41:2.97. A molten glass was prepared by melting the mixture obtained at a temperature of 1300 to 1400° C. After quenching the molten glass in pure water, the glass block was crushed to a mean particle size of 2 μm using a vibration mill to obtain a non-reducing glass frit.

$TiO_2$, at least one of $Co_3O_4$ and CoO, and ZnO were prepared as a first, second and third additives, respectively, and they were crushed to a mean particle size of 2 μm using a vibration mill. Then, the mixtures shown in TABLE 1 were obtained by adding respective compounds above into a mixture of the conductive material of $Nb_xLa_{1-x}B_{6-4x}$ and non-reducing glass frit. The parameter x in TABLE 1 shows the composition ratio in the conductive material of $Nb_xLa_{1-x}B_{6-4x}$ or the composition ratio of $NbB_2+LaB_6=x+(1-x)$ in the mixed system.

TABLE 1

| Sample No. | x | Conductive Material (wt %) | Glass Frit (wt %) | $TiO_2$ (wt %) | $Co_3O_4$ (wt %) | CoO (wt %) | ZnO (wt %) |
|---|---|---|---|---|---|---|---|
| *1 | 0.50 | 60 | 40 | 0 | 0 | 0 | 0 |
| *2 | 0.50 | 60 | 40 | 5 | 7 | 0 | 0 |
| 3 | 0.50 | 60 | 40 | 5 | 7 | 0 | 3 |
| *4 | 0.50 | 60 | 40 | 11 | 7 | 0 | 3 |
| *5 | 0.25 | 60 | 40 | 0 | 0 | 0 | 0 |
| *6 | 0.25 | 60 | 40 | 5 | 7 | 0 | 0 |
| 7 | 0.25 | 60 | 40 | 5 | 7 | 0 | 3 |
| *8 | 0.25 | 60 | 40 | 5 | 16 | 0 | 3 |
| *9 | 0.75 | 60 | 40 | 0 | 0 | 0 | 0 |
| *10 | 0.75 | 60 | 40 | 5 | 7 | 0 | 0 |
| 11 | 0.75 | 60 | 40 | 2 | 7 | 0 | 3 |
| 12 | 0.75 | 60 | 40 | 5 | 7 | 0 | 3 |
| 13 | 0.75 | 60 | 40 | 9 | 7 | 0 | 3 |
| *14 | 0.75 | 60 | 40 | 11 | 7 | 0 | 3 |
| 15 | 0.75 | 60 | 40 | 5 | 3 | 0 | 3 |
| 16 | 0.75 | 60 | 40 | 5 | 7 | 3 | 3 |
| 17 | 0.75 | 60 | 40 | 5 | 9 | 5 | 3 |
| *18 | 0.75 | 60 | 40 | 5 | 16 | 0 | 3 |
| 19 | 0.75 | 60 | 40 | 5 | 7 | 0 | 1 |
| 20 | 0.75 | 60 | 40 | 5 | 7 | 0 | 2 |
| 21 | 0.75 | 60 | 40 | 5 | 7 | 0 | 4 |
| *22 | 0.75 | 60 | 40 | 5 | 7 | 0 | 6 |
| *23 | 0.95 | 60 | 40 | 0 | 0 | 0 | 0 |
| *24 | 0.95 | 60 | 40 | 5 | 7 | 0 | 0 |
| 25 | 0.95 | 60 | 40 | 5 | 7 | 0 | 1 |
| 26 | 0.95 | 60 | 40 | 5 | 7 | 0 | 2 |
| 27 | 0.95 | 60 | 40 | 5 | 7 | 0 | 4 |
| *28 | 0.95 | 60 | 40 | 5 | 7 | 0 | 6 |
| 29 | 0.95 | 60 | 40 | 2 | 7 | 0 | 3 |
| 30 | 0.95 | 60 | 40 | 5 | 7 | 0 | 3 |
| 31 | 0.95 | 60 | 40 | 9 | 7 | 0 | 3 |
| *32 | 0.95 | 60 | 40 | 11 | 7 | 0 | 3 |

After adding an organic vehicle prepared by dissolving an acrylic resin in α-terepineol, a resistive paste was obtained by kneading the mixture.

Each paste was screen-printed with a length of 1.0 mm, a width of 1.0 mm and a dry film thickness of 20 μm among the copper electrodes on the low sintering temperature substrate on which copper electrode were formed, followed by drying at 150° C. for 10 minutes. The printed paste was baked by keeping a peak temperature of 900° C. for 10 minutes in a tunnel furnace under a nitrogen atmosphere, thus obtaining samples in which a resistor was formed.

The surface resistivity (1.0×1.0 mm□) and TRC (cold TCR: measured at a temperature between 25 and −55° C., hot TCR: measured at a temperature between 25 to 150° C.) with respect to each sample were obtained. The results are shown in TABLE 2.

TABLE 2

| Sample No. | Surface Resistance (Ω/□) | TCR(ppm/° C.) Cold (−55° C.) | TCR(ppm/° C.) Hot (+150° C.) |
|---|---|---|---|
| *1 | 21 | +485 | +470 |
| *2 | 23 | +185 | +235 |
| 3 | 25 | +95 | +75 |
| *4 | 28 | −630 | −235 |
| *5 | 27 | +460 | +445 |
| *6 | 31 | +165 | +220 |
| 7 | 26 | +80 | +60 |
| *8 | 28 | −220 | −230 |
| *9 | 130 | +430 | +390 |
| *10 | 131 | +180 | +220 |
| 11 | 135 | +130 | +150 |
| 12 | 140 | −15 | −30 |

TABLE 2-continued

| Sample No. | Surface Resistance (Ω/□) | TCR(ppm/° C.) Cold (−55° C.) | Hot (+150° C.) |
|---|---|---|---|
| 13 | 147 | −135 | −20 |
| *14 | 160 | −570 | −260 |
| 15 | 133 | +140 | +135 |
| 16 | 139 | +20 | +15 |
| 17 | 143 | −130 | −120 |
| *18 | 171 | −350 | −325 |
| 19 | 127 | +125 | +130 |
| 20 | 131 | +45 | +5 |
| 21 | 143 | −15 | −155 |
| *22 | 255 | −75 | −230 |
| *23 | 13 | +505 | +490 |
| *24 | 15 | +205 | +240 |
| 25 | 13 | +150 | +135 |
| 26 | 14 | +100 | +60 |
| 27 | 16 | −15 | −75 |
| *28 | 35 | −105 | −240 |
| 29 | 15 | +140 | +100 |
| 30 | 16 | −35 | −15 |
| 31 | 18 | −85 | −30 |
| *32 | 19 | −430 | −235 |

The samples marked by asterisk (*) in TABLE 1 and TABLE 2 denotes the comparative examples out of the preferable range of the present invention while the others are all the examples within the preferable range of the present invention. The sample Nos 1 to 22 correspond to $Nb_xLa_{1-x}B_{6-4x}$ solid solution based conductive materials and the sample Nos 23 to 32 correspond to $(NbB_2+LaB_6)$ mixed conductive materials.

Figure 2A:
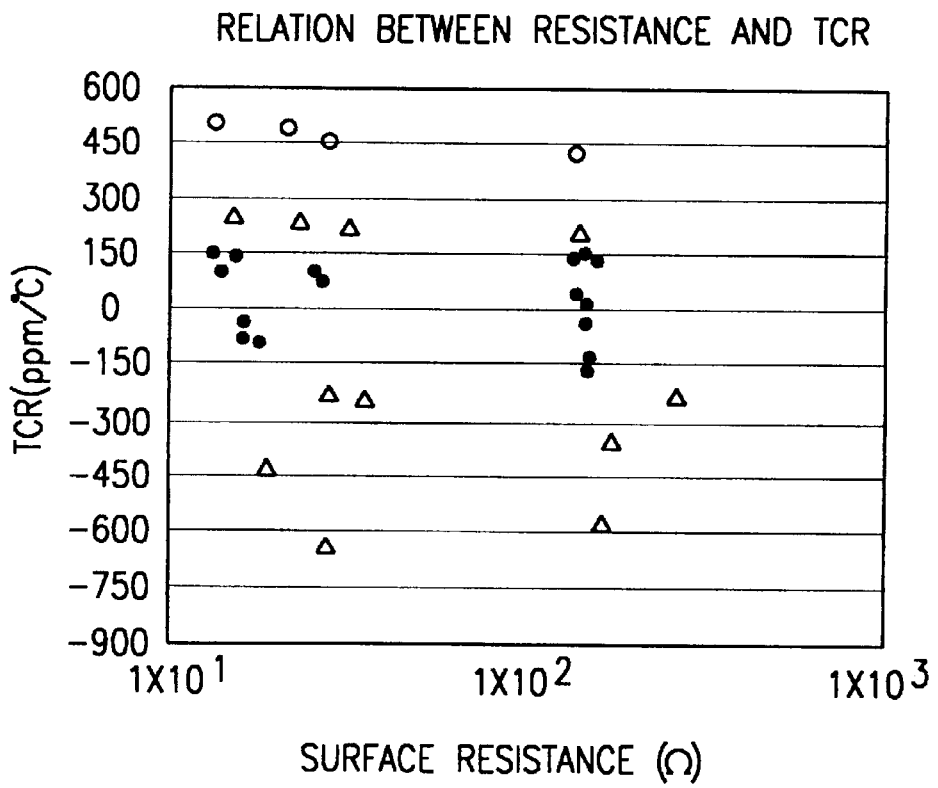
FIG. 2A is a graph showing the relation between the surface resistance and TCR in a comparative example and a first preferred embodiment of the present invention.

FIG. 2A shows the relation between the surface resistance and TCR in each sample listed in TABLE 2. The TCR having the larger absolute value for either the cold TCR or hot TCR is plotted in the graph. The mark ○ in FIG. 2A denotes the samples in which any additives are not added to the solid solution sample or mixture sample, the mark Δ denotes the samples in which additives out of the preferred range of the present invention are added and the mark ● denotes the samples in which additives within the preferred range of the present invention are added.

As shown in TABLE 1, TABLE 2 and FIG. 2A, TCRs are shifted to downward in the samples in which titanium oxide ($TiO_2$), cobalt oxide (at least one of $Co_3O_4$ or CoO) and ZnO were added in a preferable range of the present invention, as compared with the comparative samples in which any additives are not added, along with allowing TCR to approach to 0 ppm/° C. when the two categories of the samples are compared at the same level of resistance with each other.

As hitherto described, TCRs in the sample having the amount of additives within the preferred range of the present invention falls within the range of ±150 ppm/° C., indicating that adjustment of TCR is possible by changing the amount of additives. The samples in which the amount of additives is out of the preferred range of the present invention show deterioration of TCR and increase of resistance, as well as additional deterioration of resistance and TCR with respect to repeatability and uniformity.

From the results discussed above, it can be concluded that adding about 1 to 10 parts by weight of titanium oxide ($TiO_2$), about 1 to 15 parts by weight of cobalt oxide (at least one of $Co_3O_4$ and CoO) and about 1 to 5 parts by weight of zinc oxide (ZnO) relative to 100 parts by weight of the total amount of the conductive material and non-reducing glass frit is especially preferable with respect to the amount of addition of the additives.

While the composition ratios (x) of conductive materials were 0.5, 0.25 and 0.75 in the solid solution system and 0.95 in the mixture system, the ratios are not limited thereto. Also the compositions can be used alone or in combination.

The composition ratios of the non-reducing glass frit are also not limited within the range used in the examples but the non-reducing glass frits providing other materials and composition ratios can be used.

The substrate to form the resistor is not necessarily limited to the low sintering temperature substrate shown in the examples but the present invention is applicable in forming the resistors on substrates comprising various kinds of materials.

The present invention is by no means restricted to the examples but various applications and modifications within the range not departing from the spirit of the present invention are possible with respect to the materials, compositions, baking conditions and atmosphere.

According to the resistor materials, and the resistive pastes and resistors of the present invention as hitherto described, the resistor material contains the conductive material and additive, wherein the conductive material contains a conductive material represented by the general formula of $Nb_xLa_{1-x}B_{6-4x}$ (x=about 0.1 to 0.9) or a conductive material comprising 100 to about 90 mol % of $NbB_2$ and 0 to about 10 mol % of $LaB_6$, and the additive contains titanium oxide ($TiO_2$), cobalt oxide (at least one of $Co_3O_4$ and CoO) and zinc oxide (ZnO). Accordingly, TCR in the region of low surface resistance (about 10Ω/□ to 100Ω/□) can be allowed to shift from plus direction to minus direction in the resistor formed by baking the resistive paste containing the foregoing resistor material, enabling an adjustment of TCR that is practically required in the resistive paste to be baked in a neutral or reducing atmosphere.

The effect as described above can be securely attained when the amount of addition of the additives relative to 100 parts by weight of the total amount of the conductive material and non-reducing glass frit is selected to be about 1 to 10 parts by weight of titanium oxide ($TiO_2$), about 1 to 15 parts by weight of cobalt oxide (at least one of $Co_3O_4$ and CoO) and about 1 to 5 parts by weight of zinc oxide (ZnO).

A paste with a good adhesive property to the substrate and being free from flowing out of the glass component can be obtained when the blend ratio between the conductive material and non-reducing glass frit is selected in the range from about 70 to 10 parts by weight through about 30 to 90 parts by weight.

[Second Preferred Embodiment]

The resistive paste according to the preferred embodiment of the present invention comprises a conductive material represented by a general formula of $Nb_xLa_{1-x}B_{6-4x}$ (x=about 0.1 to 0.9), a non-reducing glass frit and an additive, the additive added to the resistor material comprising about 1 to 5 parts by weight of titanium oxide ($TiO_2$), about 1 to 10 parts by weight of cobalt oxide (at least one of $Co_3O_4$ and CoO) and about 1 to 5 parts by weight of silicon oxide ($SiO_2$) relative to 100 parts by weight of the combined amount of the conductive material and the non-reducing glass frit.

The resistor material described above is formed into a resistive paste by adding an organic vehicle thereto followed by kneading. A resistor is formed by coating and baking the resistive paste.

The preferable particle size of the foregoing conductive material $Nb_xLa_{1-x}B_{6-4x}$ is in the range of about 0.1 to 5 μm, a range of about 0.1 to 3 μm being more preferable.

Borosilicate glass or boroalumino silicate glass containing Ba, Ca or other alkaline earth metals is selected for use as the non-reducing glass frit. The particle size of the non-reducing glass frit is preferably in the range of about 1 to 10 μm, more preferably in the range of about 1 to 5 μm.

In the resistor material described above, about 1 to 5 parts by weight of titanium oxide ($TiO_2$), 1 to 10 parts by weight of cobalt oxide (at least one of $Co_3O_4$ and CoO) and about 1 to 5 parts by weight of silicon oxide ($SiO_2$) were added as additives relative to 100 parts by weight of the combined amount of the conductive material and non-reducing glass frit because when the amount of addition is lower than the range described above, the regulation effect for resistance and TCR of the resistor obtained from the resistive paste containing the resistor material may become insufficient while when the amount of addition is higher than the range described above, the resistance becomes high besides TCR is largely shifted from zero and repeatability becomes poor.

The blending ratio between the conductive material against the non-reducing glass frit is selected to be in a range of from about 70 through 10 parts by weight to from about 30 through 90 parts by weight in the resistor material according to the foregoing embodiments. This allows the conductive paste to have good adhesion to the substrate as well as making it possible to obtain a conductive paste being free from flowing out of the glass component. In more detail, when the proportion of the non-reducing glass frit is lower than the range described above, the adhesive property of the resistor, obtained by coating the resistive paste containing the resistor material on the substrate followed by baking, to the substrate is decreased while when the proportion of the non-reducing glass frit is higher than the range described above, the glass component in the resistive paste may be flow out, thus deteriorating the adhesive property of the solder to the electrodes disposed in closely adjoining relation with each other as well as causing practically inappropriate defects such as rapid change of resistance and poor repeatability.

The required printing characteristic is given to the resistive paste according to the present invention by adding and kneading the organic vehicle to the mixture (a solid fraction) of the conductive material and non-reducing glass frit as described previously. A variety of organic vehicles, such as a solution of ethyl cellulose resins and acrylate resins, used in thick film pastes and dissolved in a high boiling point solvent such as terpenes like α-terepineol, kerosine and carbitol acetate, can be used. Additives for endowing the paste with thixotropic property may be also added, if required.

Use of the resistive paste, obtained by adding, followed by kneading, an organic vehicle into a resistor material containing about 1 to 5 parts by weight of titanium oxide ($TiO_2$), about 1 to 10 parts by weight of cobalt oxide (at least one of $Co_3O_4$ and CoO) and about 1 to 5 parts by weight of silicon oxide ($SiO_2$) relative to 100 parts by weight of a mixture comprising about 70 to 10 parts by weight of the conductive material and about 30 to 90 parts by weight of the non-reducing glass frit, allows a resistor having TCR more close to zero to be securely formed even when the paste is coated and baked on the low sintering temperature substrate.

It was also possible for the resistive paste according to the present invention to form a resistor having TCR close to zero when the paste is coated and baked not only on the alumina substrate but also on a low sintering temperature substrate, in which a sufficient regulation effect of TCR has not been fully displayed, containing about 5 to 75% by weight of BaO, about 25 to 80% by weight of $SiO_2$, about 30% by weight or less of $Al_2O_3$, about 1.5 to 5% by weight of $B_2O_3$ and about 1.5 to 5% by weight of Cao, for example.

The resistor formed by coating and baking the resistive paste according to the present invention has a good adhesive property with the substrate, having a wide range of practically applicable surface resistivity as well as good TCR.

FIG. 1 is a sectional view showing a multi-layered ceramic substrate according to the preferred embodiment of the present invention.

The resistor 17 is formed by providing the above described resistive paste of the present invention to the multi-layered ceramic body so as to connect the baked surface conductors 3 and 4 and then baking the resistive paste in a neutral or reducing atmosphere.

Because the explanation of FIG. 1 is the same as described in the first preferred embodiment, a duplicative description is omitted.

A specific example will be described hereinafter.

BaO, $SiO_2$, $Al_2O_3$, CaO and $B_2O_3$ blended in a weight ratio of 30:60:5:2:3 were crushed and mixed, and the mixture was calcinated at a temperature of 850 to 950° C. followed by further crushing. After adding an organic binder to the powder obtained, the mixture was formed into a sheet with a thickness of 128 μm by the doctor blade method. The sheet cut into a given size was then screen-printed with a copper paste followed by drying and press mold to obtain a substrate. This substrate was then calcinated and baked in an electric furnace at a temperature of 850 to 1000° C. in a nitrogen (99.7 to 99.8% of $N_2$)—steam atmosphere using nitrogen as a carrier gas containing a small amount of oxygen and hydrogen, thereby obtaining a substrate on which copper electrodes were formed.

Meanwhile, after producing a conductive material having a composition of $Nb_xLa_{1-x}B_{6-4x}$ (x=about 0.1 to 0.9) and non-reducing glass frit by the procedure to be described hereinafter, a resistive paste was produced by adding the required additive and organic vehicle.

Firstly, powders of $NbB_2$ and $LaB_6$ as starting materials of the conductive material were prepared. Respective powders were weighed and mixed to be a composition of $Nb_xLa_{1-x}B_{6-4x}$ (x=about 0.1 to 0.9) and a synthetic material forming a solid solution containing $NbB_2$ and $LaB_6$ was produced by baking in a nitrogen ($N_2$) atmosphere for more than 2 hours in a crucible while setting the peak temperature at 1000° C. The temperature increase rate was adjusted to 3° C. per one minute. The synthetic material obtained was crushed up to a mean particle size of 0.5 μm using a vibration mill and a conductive material with a composition of $Nb_xLa_{1-x}B_{6-4x}$ was obtained thereafter by drying the crushed powder.

Besides the conductive material, $B_2O_3$, $SiO_2$, BaO, CaO, $Nb_2O_5$ and $K_2O$ were prepared as starting materials of the non-reducing glass frit, and mixed in a molar ratio of 35.56:31.24:17.78:10.04:2.41:2.97. A molten glass was prepared by melting the mixture obtained at a temperature of 1300 to 1400° C. After quenching the molten glass in pure water, the glass block was crushed to a mean particle size of 2 μm using the vibration mill to obtain a non-reducing glass frit.

$TiO_2$, at least one of $Co_3O_4$ and CoO, and $SiO_2$ were prepared as a first, second and third additives, respectively, and they were crushed to a mean particle size of 2 μm using the vibration mill. Then, the mixtures shown in TABLE 1 were obtained by adding respective compounds above into a mixture of the conductive material of $Nb_xLa_{1-x}B_{6-4x}$ and non-reducing glass frit. The parameter x in TABLE 3 shows the composition ratio in the conductive material of $Nb_xLa_{1-x}B_{6-4x}$ or the composition ratio of $NbB_2+LaB_6=x+(1-x)$ in the mixed system.

TABLE 3

| Sample No. | x | Conductive Material (wt %) | Glass Frit (wt %) | $TiO_2$ (wt %) | $Co_3O_4$ (wt %) | CoO (wt %) | $SiO_2$ (wt %) |
| --- | --- | --- | --- | --- | --- | --- | --- |
| *101 | 0.50 | 40 | 60 | 0 | 0 | 0 | 0 |
| *102 | 0.50 | 40 | 60 | 3 | 5 | 0 | 0 |
| 103 | 0.50 | 40 | 60 | 3 | 5 | 0 | 3 |
| *104 | 0.50 | 40 | 60 | 6 | 5 | 0 | 3 |
| *105 | 0.25 | 40 | 60 | 0 | 0 | 0 | 0 |
| *106 | 0.25 | 40 | 60 | 3 | 5 | 0 | 0 |
| 107 | 0.25 | 40 | 60 | 3 | 5 | 0 | 3 |
| *108 | 0.25 | 40 | 60 | 3 | 11 | 0 | 3 |
| *109 | 0.75 | 40 | 60 | 0 | 0 | 0 | 0 |
| *110 | 0.75 | 40 | 60 | 3 | 5 | 0 | 0 |
| 111 | 0.75 | 40 | 60 | 1 | 5 | 0 | 3 |
| 112 | 0.75 | 40 | 60 | 2 | 5 | 0 | 3 |
| *113 | 0.75 | 40 | 60 | 6 | 5 | 0 | 3 |
| 114 | 0.75 | 40 | 60 | 3 | 2 | 0 | 3 |
| 115 | 0.75 | 40 | 60 | 3 | 3 | 2 | 3 |
| 116 | 0.75 | 40 | 60 | 3 | 5 | 4 | 3 |
| *117 | 0.75 | 40 | 60 | 3 | 11 | 0 | 3 |
| 118 | 0.75 | 40 | 60 | 3 | 5 | 0 | 1 |
| 119 | 0.75 | 40 | 60 | 3 | 5 | 0 | 2 |
| 120 | 0.75 | 40 | 60 | 3 | 5 | 0 | 4 |
| *121 | 0.75 | 40 | 60 | 3 | 5 | 0 | 6 |

After adding an organic vehicle prepared by dissolving an acrylic resin in α-terpineol, a resistive paste was obtained by kneading the mixture.

Each paste was screen-printed with a length of 1.0 mm, a width of 1.0 mm and a dry film thickness of 20 μm among the copper electrodes on the low sintering temperature substrate on which the copper electrodes has been formed, followed by drying at 150° C. for 10 minutes. The printed paste was baked by keeping a peak temperature of 900° C. for 10 minutes in a tunnel furnace under a nitrogen atmosphere, thus obtaining samples in which a resistor was formed.

The surface resistivity (1.0×1.0 mm □) and TRC (cold TCR: at a temperature between 25 and −55° C., hot TCR: at a temperature between 25 to 150° C.) were measured with respect to each sample obtained. The results are shown in TABLE 4.

TABLE 4

| Sample No. | Surface Resistance (Ω/□) | TCR(ppm/° C.) Cold (−55° C.) | TCR(ppm/° C.) Hot (+150° C.) |
| --- | --- | --- | --- |
| *101 | 235 | +355 | +340 |
| *102 | 305 | +170 | +200 |
| 103 | 335 | +105 | +120 |
| *104 | 350 | −320 | −110 |
| *105 | 108 | +380 | +360 |
| *106 | 160 | +190 | +220 |
| 107 | 175 | +80 | +60 |
| *108 | 185 | −430 | −175 |
| *109 | 675 | +290 | +280 |
| *110 | 730 | +165 | +290 |
| 111 | 855 | +125 | +150 |
| 112 | 880 | +105 | +140 |
| *113 | 910 | −270 | −145 |
| 114 | 720 | +140 | +130 |
| 115 | 865 | +80 | +90 |
| 116 | 970 | −105 | −90 |
| *117 | 2150 | −680 | −530 |
| 118 | 845 | +75 | +135 |
| 119 | 1060 | +25 | +60 |
| 120 | 2135 | −30 | −5 |
| *121 | 3560 | −245 | −205 |

The samples marked by asterisk (*) in TABLE 3 and TABLE 4 denotes the comparative examples out of the preferable range of the present invention while the others are all the examples within the preferable range of the present invention.

Figure 2B:
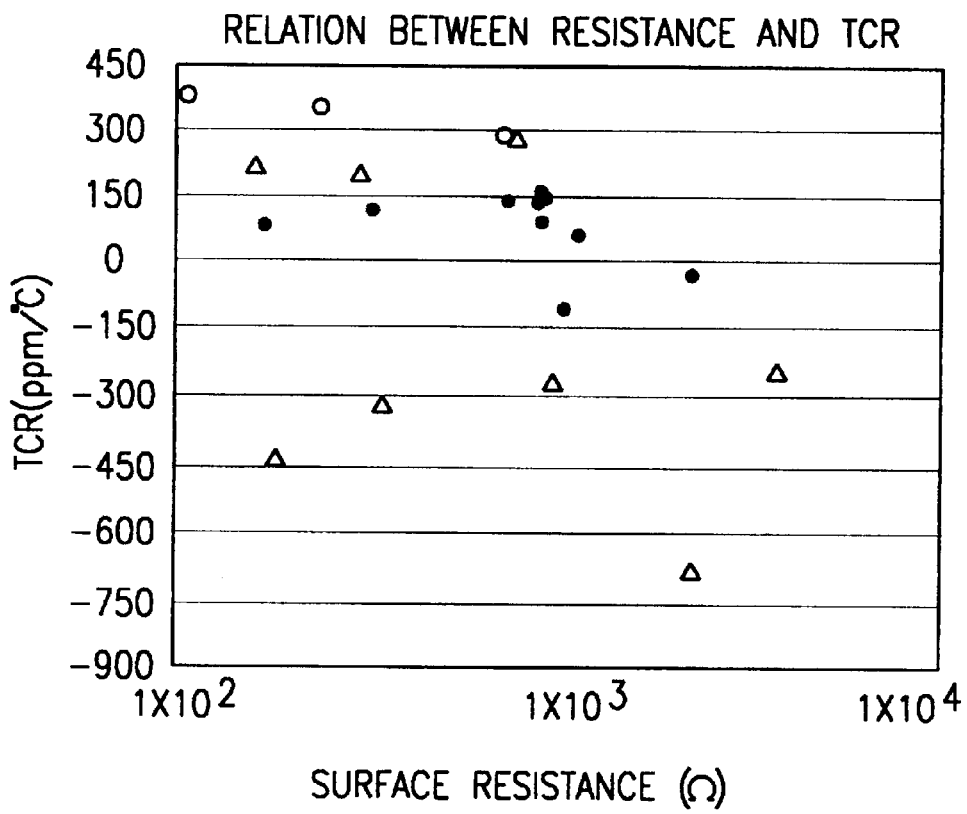
FIG. 2B is a graph showing the relation between the surface resistance and TCR in a comparative example and a second preferred embodiment of the present invention.

FIG. 2B shows the relation between the surface resistance and TCR in each sample listed in TABLE 3. The TCR having the larger absolute value in either the cold TCR or hot TCR is plotted in the graph. The mark ○ in FIG. 2B denotes the samples in which any additives are not added in the solid solution sample or mixture sample, the mark Δ denotes the samples in which additives out of the preferred range of the present invention are added and the mark ● denotes the samples in which additives within the preferred range of the present invention are added.

As shown in TABLE 3, TABLE 4 and FIG. 2B, TCRs are shifted to downward in the samples in which titanium oxide ($TiO_2$), cobalt oxide (at least one of $Co_3O_4$ or CoO) and silicon oxide ($SiO_2$) were added in a preferable range of the present invention, as compared with the comparative samples in which any additives are not added, along with allowing TCR to approach to 0 ppm/° C. when the two categories of the samples are compared at the same level of resistance with each other.

As hitherto described, TCRs in the sample having the amount of additives within the preferred range of the present invention falls within the range of ±150 ppm/° C., indicating that adjustment of TCR is possible by changing the amount of additives. The samples in which the amount of additives is out of the preferred range of the present invention show deterioration of TCR and increase of resistance, as well as additional deterioration of resistance and TCR with respect to repeatability and uniformity.

From the results discussed above, it can be concluded that adding about 1 to 5 parts by weight of titanium oxide ($TiO_2$), about 1 to 10 parts by weight of cobalt oxide (at least one of $Co_3O_4$ and CoO) and about 1 to 5 parts by weight of silicon oxide ($SiO_2$) relative to 100 parts by weight of the total amount of the conductive material and non-reducing glass frit is especially preferable with respect to the amount of addition of the additives.

While the composition ratios (x) in the conductive material were 0.5, 0.25 and 0.75 in this example, the ratios are not limited thereto. The compositions can be used alone or in combination.

The composition ratios of the non-reducing glass frit are also not limited within the range used in the examples but the non-reducing glass frits providing other materials and composition ratios can be used.

The substrate on which the resistor is to be formed is not necessarily limited to the low sintering temperature substrate shown in the examples but the present invention is applicable in forming the resistors on the substrate comprising various kinds of materials.

The present invention is by no means restricted to the examples but various applications and modifications within the range not departing from the spirit of the present invention are possible with respect to the materials, compositions, baking conditions and atmosphere.

According to the resistor materials, and the resistive pastes and resistors of the present invention as hitherto described, the resistor material comprises a conductive material and an additive, wherein the conductive material comprises a conductive material represented by a general formula of $Nb_xLa_{1-x}B_{6-4x}$ (x=about 0.1 to 0.9) and the additive contains titanium oxide ($TiO_2$), cobalt oxide (at least one of $Co_3O_4$ and CoO) and silicon oxide ($SiO_2$). Accordingly, TCR in the region of low surface resistance (about 100Ω/□ to 1 kΩ/□) can be allowed to shift from plus direction to minus direction in the resistor formed by baking the resistive paste containing the foregoing resistor material, enabling an adjustment of TCR that is practically required in the resistive paste to be baked in a neutral or reducing atmosphere.

The effect as described above can be securely attained when the amount of addition of the additives relative to 100 parts by weight of the total amount of the conductive material and non-reducing glass frit is selected to be about 1 to 5 parts by weight of titanium oxide ($TiO_2$), about 1 to 10 parts by weight of cobalt oxide (at least one of $Co_3O_4$ and CoO) and about 1 to 5 parts by weight of silicon oxide ($SiO_2$).

A paste with good adhesive property to the substrate and being free from flowing out of the glass component can be obtained when the blend ratio of the conductive material against the non-reducing glass frit is selected in the range from about 70 through 10 parts by weight to from about 30 through 90 parts by weight.

[Third Preferred Embodiment]

The resistive paste according to the preferred embodiment of the present invention is obtained from a resistive material which comprises a conductive material represented by a general formula of $Nb_xLa_{1-x}B_{6-4x}$ (x=about 0.1 to 0.9), a non-reducing glass frit and an additive, the additive comprising about 5 to 15 parts by weight of aluminum nitride (AlN) with a mean particle size of about 0.5 μm or less and about 1 to 5 parts by weight of silicon oxide ($SiO_2$) with a mean particle size of about 0.5 μm or less relative to 100 parts by weight of the combined amount of the conductive material and the non-reducing glass frit.

The resistor material described above is formed into a resistive paste by adding an organic vehicle thereto followed by kneading. A resistor is formed by coating and baking the resistive paste.

The preferable particle size of the foregoing conductive material $Nb_xLa_{1-x}B_{6-4x}$ is in a range of about 0.1 to 5 μm, a range of about 0.1 to 3 μm being more preferable.

Borosilicate glass or boroalumino silicate glass containing Ba, Ca or other alkali earth metals is selected for use as the non-reducing glass frit. The particle size of the non-reducing glass frit is preferably in a range of about 1 to 10 μm, more preferably in a range of about 1 to 5 μm.

In the resistor material described above, about 5 to 15 parts by weight of aluminum nitride (AlN) with a mean particle size of about 0.5 μm or less and silicon oxide ($SiO_2$) with a mean particle size of about 0.5 μm or less were added as additives relative to 100 parts by weight of the combined amount of the conductive material and non-reducing glass frit because when the amount of addition is lower than the range described above, the regulation effect for resistance and TCR of the resistor obtained from the resistive paste containing the resistor material may become insufficient while when the amount of addition is higher than the range described above, the resistance is rapidly increased besides TCR is remarkably deteriorated and repeatability becomes poor.

The blending ratio between the conductive material against the non-reducing glass frit is preferably selected to be in a range of from 70 through 10 parts by weight to from 30 through 90 parts by weight in the resistor material according to the foregoing embodiments. This allows the conductive paste to have good adhesion to the substrate as well as making it possible to obtain a conductive paste being free from flowing out of the glass component. In more detail, when the proportion of the non-reducing glass frit is lower than the range described above, the adhesive property of the resistor, obtained by coating the resistive paste containing the resistor material on the substrate followed by baking, to the substrate is decreased while when the proportion of the non-reducing glass frit is higher than the range described above, the glass component in the resistive paste may be flow out during the baking process, thus deteriorating the adhesive property of the solder to the electrodes disposed in closely adjoining relation with each other as well as causing practically inappropriate defects such as rapid change of resistance and poor repeatability.

The required printing characteristic is given to the resistive paste according to the present invention by adding and kneading the organic vehicle to the mixture (a solid fraction) of the conductive material and non-reducing glass frit as described previously. A variety of organic vehicles, such as a solution of ethyl cellulose resins and acrylate resins, used in thick film pastes and dissolved in a high boiling point solvent such as terpenes like α-terepineol, kerosine and carbitol acetate, can be used. Additives for endowing the paste with thixotropic property may be also added, if required.

Use of the resistive paste, obtained by adding, followed by kneading, an organic vehicle into a resistor material containing about 5 to 15 parts by weight of aluminum nitride (AlN) with a mean particle size of about 0.5 μm and about 1 to 5 parts by weight of silicon oxide ($SiO_2$) with a mean particle size of about 0.5 μm relative to 100 parts by weight of a mixture comprising about 70 to 10 parts by weight of the conductive material and about 30 to 90 parts by weight of the non-reducing glass frit, allows a resistor having TCR more close to zero to be securely formed even when the paste is coated and baked on the low sintering temperature substrate.

It was also possible for the resistive paste according to the present invention to form a resistor having TCR close to zero when the paste is coated and baked not only on the alumina substrate but also on a low sintering temperature substrate, in which a sufficient regulation effect of TCR has not been fully displayed, containing about 15 to 75% by weight of BaO, about 25 to 80% by weight of $SiO_2$, about 30% by weight or less of $Al_2O_3$, about 1.5 to 5% by weight of $B_2O_3$ and about 1.5 to 5% by weight of CaO, for example.

The resistor formed by coating and baking the resistive paste according to the present invention has a good adhesive property with the substrate, having a wide range of practically applicable surface resistivity as well as good TCR.

FIG. 1 is a sectional view showing a multi-layered ceramic substrate according to the preferred embodiment of the present invention.

The resistor 17 is formed by providing the above described resistive paste of the present invention to the multi-layered ceramic body so as to connect the baked surface conductors 3 and 4 and then baking the resistive paste in a neutral or reducing atmosphere.

Because the explanation of FIG. 1 is the same as described in the first preferred embodiment, duplicative description is omitted.

A specific example will be described hereinafter.

BaO, $SiO_2$, $Al_2O_3$, CaO and $B_2O_3$ blended in a weight ratio of 30:60:5:2:3 were crushed and mixed, and the mixture was calcinated at a temperature of 850 to 950° C. followed by further crushing. After adding an organic binder to the powder obtained, the mixture was formed into a sheet with a thickness of 128 μm by the doctor blade method. The sheet cut into a given size was then screen-printed with a copper paste followed by drying and press mold to obtain a substrate. This substrate was then calcinated and baked in an electric furnace at a temperature of 850 to 1000° C. in a nitrogen (99.7 to 99.8% of $N_2$)—steam atmosphere using nitrogen as a carrier gas containing a small amount of oxygen and hydrogen, thereby obtaining a substrate on which copper electrodes were formed.

Meanwhile, after producing a conductive material having a composition of $Nb_xLa_{1-x}B_{6-4x}$ (x=about 0.1 to 0.9) and non-reducing glass frit by the procedure to be described hereinafter, a resistive paste was produced by adding the required additive and organic vehicle.

Firstly, powders of $NbB_2$ and $LaB_6$ as starting materials of the conductive material were prepared. Respective powders were weighed and mixed to be a composition of $Nb_xLa_{1-x}B_{6-4x}$ (x=about 0.1 to 0.9) and a synthetic material forming a solid solution containing $NbB_2$ and $LaB_6$ was produced by baking in a nitrogen ($N_2$) atmosphere for more than 2 hours in a crucible while setting the peak temperature at 1000° C. The temperature increase rate was adjusted to 3° C. per one minute. The synthetic material obtained was crushed up to a mean particle size of 0.5 $\mu$m using a vibration mill and a conductive material with a composition of $Nb_xLa_{1-x}B_{6-4x}$ was obtained thereafter by drying the crushed powder.

Besides the conductive material, $B_2O_3$, $SiO_2$, BaO, CaO, $Nb_2O_5$ and $K_2O$ were prepared as starting materials of the non-reducing glass frit, which were mixed in a molar ratio of 35.56:31.24:17.78:10.04:2.41:2.97. A molten glass was prepared by melting the mixture obtained at a temperature of 1300 to 1400° C. After quenching the molten glass in pure water, the glass block was crushed up to a mean particle size of 2 $\mu$m using the vibration mill to obtain a non-reducing glass frit.

Then, AlN (0.2 to 0.3 $\mu$m) and $SiO_2$ (0.2 $\mu$m) were prepared by a gas phase synthesis method as a first and second additives, respectively, each having a mean particle size of 0.5 $\mu$m or less. AlN and $SiO_2$ with a mean particle size of around 1 $\mu$m, respectively, were also prepared as a comparative example with respect to particle size.

The mixtures shown in TABLE 5 were obtained by adding respective compounds above into a mixture of the conductive material of $Nb_xLa_{1-x}B_{6-4x}$ and non-reducing glass frit.

The parameter x in TABLE 5 shows the composition ratio in the conductive material of $Nb_xLa_{1-x}B_{6-4x}$. AlN with a mean particle size of around 1 $\mu$m prepared as a comparative example and $SiO_2$ with a mean particle size of around 1 $\mu$m were used as the samples 221 and 222, respectively, in TABLE 5.

TABLE 5

| Sample No. | X | Conductive Material (wt %) | Glass Frit (wt %) | AlN (wt %) | $SiO_2$ (wt %) |
|---|---|---|---|---|---|
| *201 | 0.50 | 20 | 80 | 0 | 0 |
| *202 | 0.50 | 20 | 80 | 10 | 0 |
| 203 | 0.50 | 20 | 80 | 10 | 3 |
| *204 | 0.50 | 20 | 80 | 16 | 3 |
| *205 | 0.75 | 20 | 80 | 0 | 0 |
| *206 | 0.75 | 20 | 80 | 4 | 3 |
| 207 | 0.75 | 20 | 80 | 5 | 3 |
| 208 | 0.75 | 20 | 80 | 10 | 3 |
| 209 | 0.75 | 20 | 80 | 15 | 3 |
| *210 | 0.75 | 20 | 80 | 16 | 3 |
| *211 | 0.75 | 20 | 80 | 5 | 0 |
| 212 | 0.75 | 20 | 80 | 5 | 1 |
| 213 | 0.75 | 20 | 80 | 5 | 2 |
| 214 | 0.75 | 20 | 80 | 5 | 5 |
| *215 | 0.75 | 20 | 80 | 5 | 6 |
| 216 | 0.75 | 20 | 80 | 10 | 1 |
| 217 | 0.75 | 20 | 80 | 10 | 2 |
| 218 | 0.75 | 20 | 80 | 10 | 5 |
| *219 | 0.75 | 20 | 80 | 10 | 6 |
| 220 | 0.75 | 20 | 80 | 15 | 5 |
| *221 | 0.75 | 20 | 80 | 15 | 5 |
| *222 | 0.75 | 20 | 80 | 15 | 5 |
| *223 | 0.75 | 15 | 85 | 0 | 0 |

After adding an organic vehicle prepared by dissolving an acrylic resin in α-terpineol, a resistive paste was obtained by kneading the mixture.

Each paste was screen-printed with a length of 1.0 mm, a width of 1.0 mm and a dry film thickness of 20 mm among the copper electrodes on the low sintering temperature substrate on which the copper electrodes has been formed, followed by drying at 150° C. for 10 minutes. The printed paste was baked by keeping a peak temperature of 900° C. for 10 minutes in a tunnel furnace under a nitrogen atmosphere, thus obtaining samples in which a resistor was formed.

The surface resistivity (1.0×1.0 mm□) and TRC (cold TCR: at a temperature between 25 and −55° C., hot TCR: at a temperature between 25 to 150° C.) were measured with respect to each sample obtained. The results are shown in TABLE. 6.

TABLE 6

| Sample No. | Surface Resistance (Ω/□) | TCR(ppm/° C.) Cold (−55° C.) | TCR(ppm/° C.) Hot (+150° C.) |
|---|---|---|---|
| *201 | 1.33 | −215 | −175 |
| *202 | 2.85 | −195 | −160 |
| 203 | 4.65 | −140 | −125 |
| *204 | 7.80 | −230 | −205 |
| *205 | 5.76 | −325 | −305 |
| *206 | 8.35 | −215 | −190 |
| 207 | 7.65 | −15 | −25 |
| 208 | 13.5 | −75 | −100 |
| 209 | 20.5 | −150 | −135 |
| *210 | 41.6 | −750 | −540 |
| *211 | 6.38 | +185 | +195 |
| 212 | 5.95 | +150 | +145 |
| 213 | 6.35 | +75 | +80 |
| 214 | 16.3 | −135 | −115 |
| *215 | 43.2 | −450 | −405 |
| 216 | 9.75 | +135 | +120 |
| 217 | 11.6 | +35 | +15 |
| 218 | 23.2 | −120 | −105 |
| *219 | 39.3 | −365 | −330 |
| 220 | 35.8 | −145 | −140 |
| *221 | 6.36 | −330 | −310 |
| *222 | 6.15 | −305 | −290 |
| *223 | 10.3 | −635 | −580 |

The samples marked with asterisk (*) in TABLE 5 and TABLE 6 denotes the comparative examples out of the preferable range of the present invention while the others are all the examples within the preferable range of the present invention.

Figure 2C:
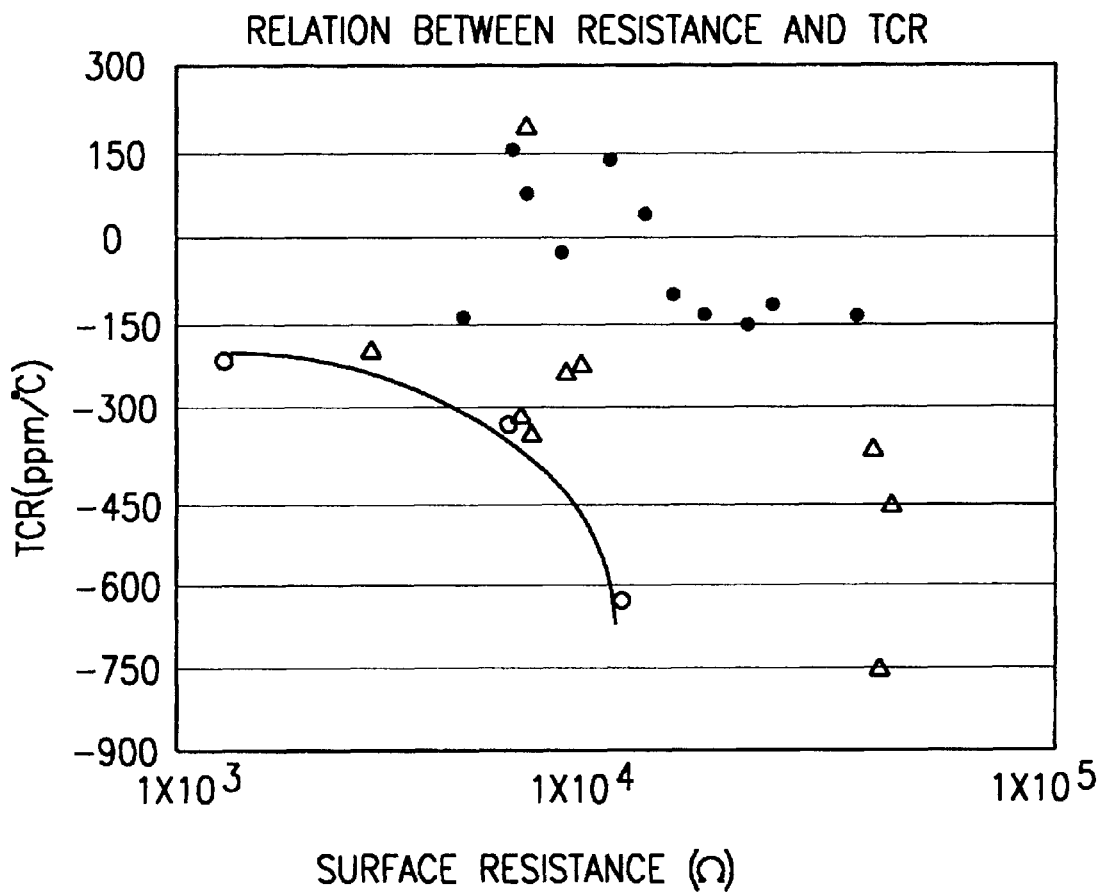
FIG. 2C is a graph showing the relation between the surface resistance and TCR in a comparative example and a third preferred embodiment of the present invention.

FIG. 2C shows the relation between the surface resistance and TCR in each sample listed in TABLE 2. The TCR having the larger absolute value in either the cold TCR or hot TCR is plotted in the graph. The mark ○ in FIG. 2C denotes the samples in which any additives are not added in the solid solution sample or mixture sample, the mark Δ denotes the samples in which additives out of the preferred range of the present invention are added and the mark ● denotes the samples in which additives within the preferred range of the present invention are added.

As shown in TABLE 5, TABLE 6 and FIG. 2C, TCRs are positioned at upward in the samples in which aluminum nitride (AlN) with a mean particle size of about 0.5 μm or less and silicon oxide ($SiO_2$) with a mean particle size of about 0.5 μm or less were added in a preferable range of the present invention, as compared with the comparative samples in which any additives are not added, along with allowing TCR to approach 0 ppm/° C. when the two categories of the samples are compared at the same level of resistance with each other.

As hitherto described, TCRs in the sample having the amount of additives within the preferred range of the present invention falls within the range of ±150 ppm/° C. While TCR is within the range of ±150 ppm/° C. in merely the samples within the preferable range of the present invention, increase of resistance, remarkable deterioration of TCR and poor repeatability and uniformity of resistance and TCR are observed in the samples out of the range of the present invention, making it impossible to steadily obtain a high surface resistance region.

When AlN and $SiO_2$ having a mean particle size of around 1 μm are used as in the samples 221 and 222, a high resistance and the effect of allowing TCR to shift from minus values to the plus values, which has been displayed in the samples using AlN and $SiO_2$ each having a mean particle size of 0.5 μm or less, can not be obtained.

It can be understood from the results as hitherto described that the additives containing about 5 to 15 parts by weight of aluminum nitride (AlN) with a mean particle size of about 0.5 μm or less and about 1 to 5 parts by weight of silicon oxide ($SiO_2$) with a mean particle size of about 0.5 μm relative to 100 parts by weight of the combined amount of the conductive material and non-reducing glass frit is especially preferable.

While the composition ratios (x) in the conductive material were 0.5, 0.25 and 0.75 in this example, the ratios are not limited thereto. The compositions can be used alone or in combination.

The composition ratios of the non-reducing glass frit are also not limited within the range used in the examples but the non-reducing glass frits providing other materials and composition ratios can be used.

The substrate on which the resistor is to be formed is not necessarily limited to the low sintering temperature substrate shown in the examples but the present invention is applicable in forming the resistors on the substrate comprising various kinds of materials.

The present invention is by no means restricted to the examples but various applications and modifications within the range not departing from the spirit of the present invention are possible with respect to the materials, compositions, baking conditions and atmosphere.

According to the resistor materials, and the resistive pastes and resistors of the present invention as hitherto described, the resistor material comprises a conductive material and an additive, wherein the conductive material comprises a material represented by a general formula of $Nb_xLa_{1-x}B_{6-4x}$ (x=about 0.1 to 0.9) and the additive comprises aluminum nitride (AlN) with a mean particle size of about 0.5 μm or less and silicon oxide ($SiO_2$) with a mean particle size of about 0.5 μm or less. Accordingly, TCR in the region of low surface resistance (about 10 kΩ/□ or more) can be allowed to shift from the minus direction to the plus direction in the resistor formed by baking the resistive paste containing the foregoing resistor material, allowing the absolute value of TCR to approach to zero to securely obtain high resistance. Therefore, the resistive paste to be baked in a neutral or reducing atmosphere can be controlled to satisfy practically required TCR.

The effect as described above can be securely attained when the amount of addition of the additives relative to 100 parts by weight of the total amount of the conductive material and non-reducing glass frit is selected to be about 5 to 15 parts by weight of aluminum nitride with a mean particle size of about 0.5 pm or less and 1 to 5 parts by weight of silicon oxide ($SiO_2$) with a mean particle size of about 0.5 μm.

A paste with good adhesive property to the substrate and being free from flowing out of the glass component can be obtained when the blend ratio of the conductive material against the non-reducing glass frit is selected in the range from about 70 through 10 parts by weight to from about 30 through 90 parts by weight.

While the invention has been particularly shown and described with reference to preferred embodiments thereof, it will be understood by those skilled in the art that the forgoing and other changes in form and details may be made therein without departing from the spirit of the invention.

What is claimed is:

1. A resistor material comprising a La/B-containing conductive material and a titanium oxide or silicon oxide-containing additive;

said conductive material being selected from the group consisting of (a) a material represented by the formula $Nb_xLa_{1-x}B_{6-4x}$ wherein x is about 0.1 to 0.9, (b) and a solid solution comprising $NbB_2$ and up to about 10 mol % of $LaB_6$ and (c) a mixture thereof; and said additive comprising (a) titanium oxide, cobalt oxide and either zinc oxide or silicon oxide or (b) aluminum nitride having a mean particle size of about 0.5 μm or less and silicon oxide having a mean particle size of about 0.5 μm or less.

2. The resistor material according to claim 1, wherein said resistor material further comprises a non-reducing glass frit.

3. The resistor material according to claim 2, wherein the amounts of said conductive material and said non-reducing glass frit are from about 70 through 10 parts by weight and from about 30 through 90 parts by weight, respectively.

4. The resistor material according to claim 1, wherein said additive is (a) and contains about 1 to 10 parts by weight of titanium oxide, about 1 to 15 parts by weight of cobalt oxide and about 1 to 5 parts by weight of zinc or silicon oxide relative to 100 parts by weight of the combined amount of said conductive material and said non-reducing glass frit.

5. The resistor material according to claim 1, wherein said additive is (b).

6. The resistor material according to claim 1, wherein said conductive material is (a) a material represented by the formula $Nb_xLa_{1-x}B_{6-4x}$.

7. The resistor material according to claim 1, wherein said conductive material is (b) a material comprising $NbB_2$ and up to about 10 mol % of $LaB_6$.

8. A resistive paste an organic vehicle and said resistor material of claim 1.

9. The resistive paste according to claim 8 on a low sintering temperature substrate having a composition comprising about 15 to 75% by weight of BaO, about 25 to 80% by weight of $SiO_2$, about 30% by weight or less of $Al_2O_3$, about 1.5 to 5% by weight of $B_2O_3$ and about 1.5 to 5% by weight of CaO.

10. A resistive paste an organic vehicle and said resistor material of claim 2.

11. The resistive paste according to claim 10 on a low sintering temperature substrate having a composition comprising about 15 to 75% by weight of BaO, about 25 to 80% by weight of $SiO_2$, about 30% by weight or less of $Al_2O_3$, about 1.5 to 5% by weight of $B_2O_3$ and about 1.5 to 5% by weight of CaO.

12. A resistive paste an organic vehicle and said resistor material of claim 3.

13. The resistive paste according to claim 12 on a low sintering temperature substrate having a composition comprising about 15 to 75% by weight of BaO, about 25 to 80% by weight of $SiO_2$, about 30% by weight or less of $Al_2O_3$, about 1.5 to 5% by weight of $B_2O_3$ and about 1.5 to 5% by weight of CaO.

14. A resistor comprising the baked resistor material of claim 1.

15. A resistor comprising the baked resistor material of claim 2.

16. A resistor comprising the baked resistor material of claim 3.

17. A multi-layered ceramic substrate comprising a plurality of ceramic layers and said resistor of claim 16.

18. A multi-layered ceramic substrate comprising a plurality of ceramic layers and said resistor of claim 15.

19. A multi-layered ceramic substrate comprising a plurality of ceramic layers and said resistor of claim 14.

20. The multi-layered ceramic substrate according to claim 19 wherein at least one ceramic layer is a low sintering temperature substrate having a composition comprising about 15 to 75% by weight of BaO, about 25 to 80% by weight of $SiO_2$, about 30% by weight or less of $Al_2O_3$, about 1.5 to 5% by weight of $B_2O_3$ and about 1.5 to 5% by weight of CaO.

* * * * *